US009018625B2

(12) United States Patent
Jeoung

(10) Patent No.: US 9,018,625 B2
(45) Date of Patent: Apr. 28, 2015

(54) INVERTER AND DRIVING CIRCUIT AND DISPLAY DEVICE INCLUDING THE SAME

(71) Applicant: LG Display Co., Ltd., Seoul (KR)

(72) Inventor: Hun Jeoung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/136,999

(22) Filed: Dec. 20, 2013

(65) Prior Publication Data

US 2014/0183524 A1  Jul. 3, 2014

(30) Foreign Application Priority Data

Dec. 28, 2012  (KR) .................. 10-2012-0157092

(51) Int. Cl.
*H01L 29/12* (2006.01)
*H01L 27/12* (2006.01)

(52) U.S. Cl.
CPC .................................. *H01L 27/1225* (2013.01)

(58) Field of Classification Search
USPC ............................................................ 257/43
See application file for complete search history.

(56) References Cited

U.S. PATENT DOCUMENTS

| 4,143,388 | A  | * | 3/1979  | Esaki et al. ................... 257/327 |
| 6,020,214 | A  | * | 2/2000  | Watanabe et al. ............... 438/30 |
| 2005/0218410 | A1 | * | 10/2005 | Lai .................................. 257/72 |
| 2010/0090216 | A1 | * | 4/2010  | Ferrao De Paiva Martins et al. .............................. 257/43 |
| 2010/0110623 | A1 | * | 5/2010  | Koyama et al. ........... 361/679.01 |
| 2012/0146042 | A1 | * | 6/2012  | Kim et al. ........................ 257/72 |
| 2012/0268681 | A1 | * | 10/2012 | Yamazaki et al. .............. 349/43 |

* cited by examiner

*Primary Examiner* — Kenneth Parker
*Assistant Examiner* — Young W Kim
(74) *Attorney, Agent, or Firm* — Birch, Stewart, Kolasch & Birch, LLP

(57) ABSTRACT

An inverter includes a first N type oxide transistor operated in a depletion mode; and a second N type oxide transistor operated in a normal mode or enhancement mode, wherein an overlap area between an etch stop layer and a drain electrode of the first N type oxide transistor is greater than an overlap area between the etch stop layer and a source electrode of the first N type oxide transistor.

11 Claims, 5 Drawing Sheets

INVERTER AND DRIVING CIRCUIT AND DISPLAY DEVICE INCLUDING THE SAME

The present invention claims the benefit of Korean Patent Application No. 10-2012-0157092, filed in Korea on Dec. 28, 2012, which is hereby incorporated by reference for all purposes as if fully set forth herein.

BACKGROUND OF THE INVENTION

1. Field of the Invention

The present invention relates to an inverter, and more particularly, to an inverter using an oxide semiconductor, and a driving circuit and a display device including the same.

2. Discussion of the Related Art

With the advent of an information-oriented society, various electronic devices are used, and the electronic devices include an inverter inverting polarity of input signal.

Generally, the inverter uses a CMOS circuit having low power consumption and easy design. However, the CMOS circuit has disadvantages of high production cost and complicated production process.

To solve the problems, PMOS or NMOS in enhancement mode or depletion mode is suggested. However, the PMOS or NMOS has problems of increase of power consumption and difficulty of full swing.

Recently, research of forming a transistor using an oxide semiconductor having excellent electrical property has actively progressed. The transistor using the oxide semiconductor i.e., the oxide transistor is formed only as an N type transistor because of its property of material.

The inverter formed using the N type oxide transistor is explained with reference to FIG. 1, which is a circuit diagram of an inverter using an oxide transistor according to the related art.

Referring to FIG. 1, first and second N type oxide transistors T1 and T2 constituting an inverter IV are operated in a depletion mode and an enhancement mode, respectively. By configuring the first and second transistors T1 and T2 as shown, full swing can be achieved.

However, the first transistor T1 in the depletion mode should have a thick semiconductor layer, and the second transistor T2 in the enhancement mode should have a thin semiconductor layer. To do this, two processes are required to form the transistors, and thus production cost and process increase.

The first transistor T1 may be configured to have a double gate structure and be supplied with a positive voltage. However, a process of forming an additional gate electrode is required, design margin is reduced, and additional gate signal is required.

When a gate driving circuit is formed using an NMOS inverter, a boostrap capacitor is connected to a Q node using boostrap principle. Accordingly, a voltage of the Q node rises, thus a stress is produced at a transistor in the circuit due to a high driving voltage, and thus reliability is deteriorated. Particularly, the oxide transistor is more vulnerable to stability. However, when the gate driving circuit is formed using a CMOS inverter, the boostrap is not produced, and thus reliability is achieved.

As described above, the driving circuit using the N type oxide transistor is problematic about reliability.

SUMMARY OF THE INVENTION

Accordingly, the present invention is directed to an inverter, and a driving circuit and a display device including the same which substantially obviates one or more of the problems due to limitations and disadvantages of the related art.

An advantage of the present invention is to provide an inverter, and a driving circuit and a display device including the same that can improve reliability.

Additional features and advantages of the present invention will be set forth in the description which follows, and in part will be apparent from the description, or may be learned by practice of the invention. These and other advantages of the invention will be realized and attained by the structure particularly pointed out in the written description and claims thereof as well as the appended drawings.

To achieve these and other advantages and in accordance with the purpose of the present invention, as embodied and broadly described herein, an inverter includes a first N type oxide transistor operated in a depletion mode; and a second N type oxide transistor operated in a normal mode or enhancement mode, wherein an overlap area between an etch stop layer and a drain electrode of the first N type oxide transistor is greater than an overlap area between the etch stop layer and a source electrode of the first N type oxide transistor.

In another aspect, a gate driving circuit of a display device includes a shift register including a plurality of inverters and outputting a gate signal; wherein each inverter includes: a first N type oxide transistor operated in a depletion mode; and a second N type oxide transistor operated in a normal mode or enhancement mode, wherein an overlap area between an etch stop layer and a drain electrode of the first N type oxide transistor is greater than an overlap area between the etch stop layer and a source electrode of the first N type oxide transistor.

In yet another aspect, a display device includes a display panel; and a gate driving circuit including a shift register outputting a gate signal to a gate line of the display panel, wherein the shift register includes a plurality of inverters, and wherein each inverter includes: a first N type oxide transistor operated in a depletion mode; and a second N type oxide transistor operated in a normal mode or enhancement mode, wherein an overlap area between an etch stop layer and a drain electrode of the first N type oxide transistor is greater than an overlap area between the etch stop layer and a source electrode of the first N type oxide transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 2:
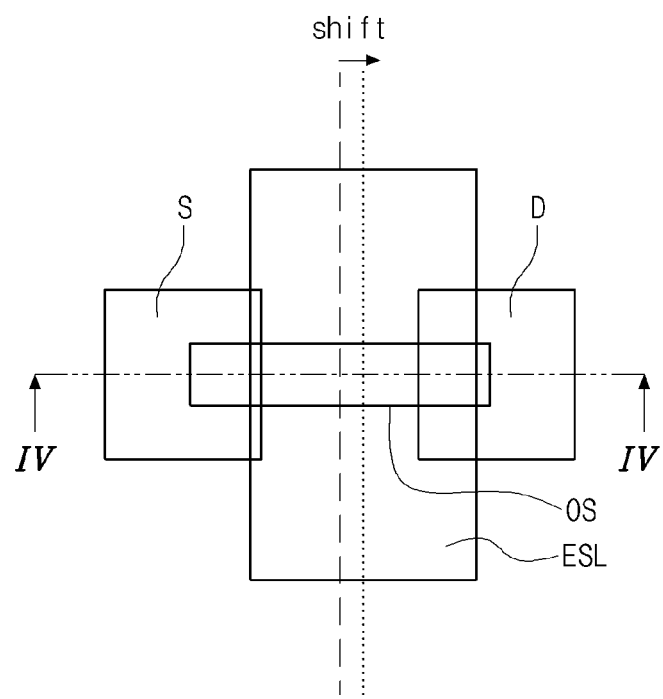
FIGS. 2 and 3 are schematic plan views illustrating first and second oxide transistors, respectively, of an inverter according to an embodiment of the present invention.
Figure 3:
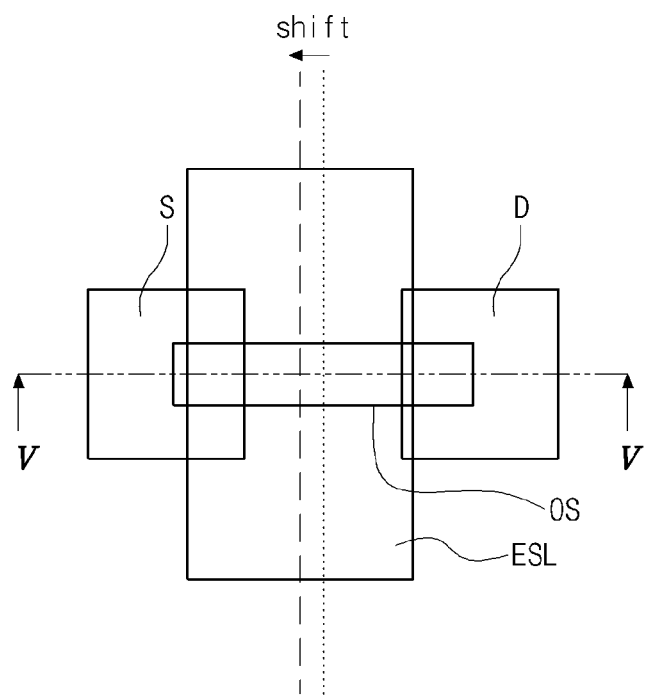
Figure 4:
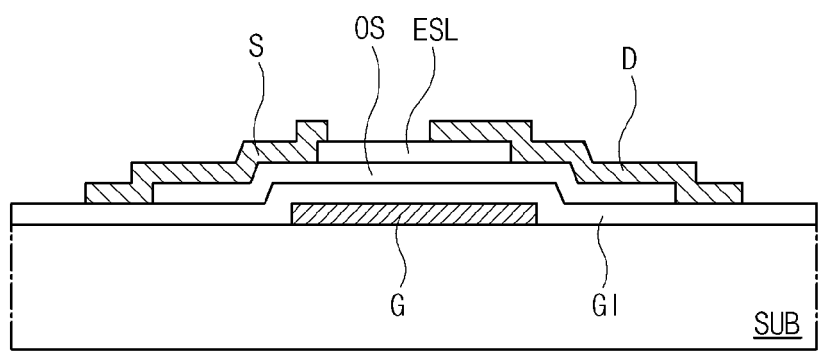
FIGS. 4 and 5 are cross-sectional views taken along a line IV-IV of FIG. 2 and V-V of FIG. 3, respectively.
Figure 5:
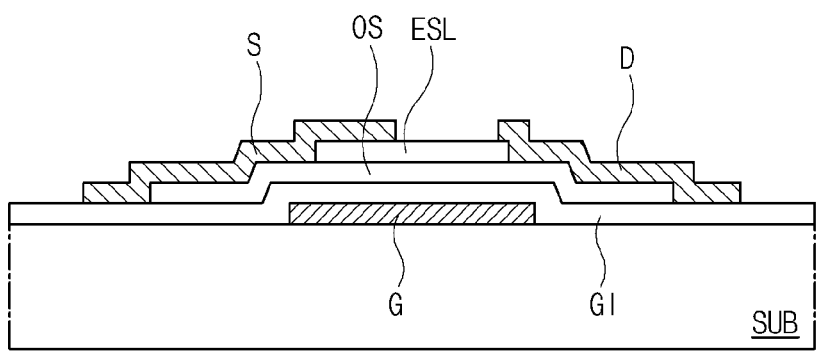

FIGS. 2 and 3 are schematic plan views illustrating first and second oxide transistors, respectively, of an inverter according to an embodiment of the present invention, and FIGS. 4 and 5 are cross-sectional views taken along a line IV-IV of FIG. 2 and V-V of FIG. 3, respectively.

Figure 1:
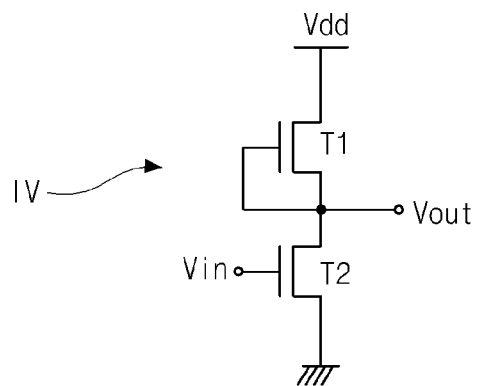
FIG. 1 is a circuit diagram of an inverter using an oxide transistor according to the related art.

An equivalent circuit of the inverter IV of the embodiment may be described with reference to FIG. 1. That is, the inverter IV includes the first and second transistors T1 and T2, which each include the oxide semiconductor.

The first transistor T1 functions as a load transistor, and the second transistor T2 functions as a switching transistor.

The first transistor T1 is operated in a depletion mode. The second transistor T2 is operated in a normal mode or enhancement mode, and preferably, is operated in the enhancement mode. In this embodiment, for the purpose of explanations, the second transistor T2 is operated in the enhancement mode.

Since the first transistor T1 is operated in the depletion mode, the first transistor T1 has a property that a threshold voltage is shifted in a negative direction with respect to a threshold voltage of a normal mode. Since the second transistor T2 is operated in the enhancement mode, the second transistor T2 has a property that a threshold voltage is shifted in a positive direction with respect to a threshold voltage of a normal mode.

To obtain the property of the threshold voltage of each of the first and second transistors T1 and T2, overlap areas between an etch stop layer ESL, and source and drain electrodes S and D is adjusted. This is explained in more detail as follows.

Each of the first and second transistors T1 and T2 includes a gate electrode G on a substrate SUB, a gate insulating layer GI on the gate electrode G, an oxide semiconductor layer OS on the gate insulating layer GI, an etch stop layer ESL on the oxide semiconductor layer OS, and source and drain electrodes S and D contacting both sides of the oxide semiconductor layer OS.

The oxide semiconductor layer OS may be made of an oxide material containing Zn, for example, but not limited to, ZnO or $InGaZnO_4$. The oxide semiconductor layer OS has an excellent electrical property such as mobility.

The etch stop layer ESL covers the oxide semiconductor layer OS, and prevents that a channel is etched in a later process and is defective. It is preferred, but not required, that the etch stop layer ESL is made of an oxide series material, for example, $SiO_2$.

In case of a transistor operated in a normal mode, the etch stop layer ESL is formed with a center thereof equal to a center of a channel. In this case, an overlap area between the etch stop layer ESL and the source electrode S is substantially equal to an overlap area between the etch stop layer ESL and the drain electrode D.

By adjusting the overlap areas between the etch stop layer ESL, and the source and drain electrodes S and D, a threshold voltage of transistor can be adjusted.

Figure 6:
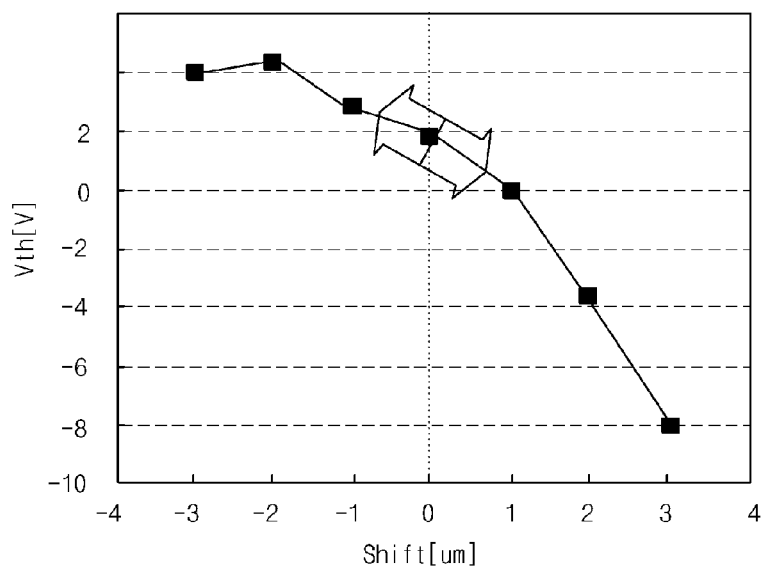
FIG. 6 is a graph of property of threshold voltage depending on overlap areas between an etch stop layer and source and drain electrodes according to the embodiment of the present invention.

This is explained with further reference to FIG. 6, which is a graph of property of threshold voltage depending on overlap areas between an etch stop layer and source and drain electrodes according to the embodiment of the present invention.

Referring to FIG. 6, a shift value along a direction to the drain electrode D is positive, and a shift value along the opposite direction is negative.

In this regard, as the etch stop layer ESL is shifted to the drain electrode D, the overlap area between the etch stop layer ESL and the drain electrode D increases, and thus the threshold voltage Vth is shifted in a negative direction.

On the contrary, as the etch stop layer ESL is shifted to the source electrode S, the overlap area between the etch stop layer ESL and the source electrode S increases, and thus the threshold voltage Vth is shifted in a positive direction.

Accordingly, by adjusting the overlap areas between the etch stop layer ESL, and the source and drain electrodes S and D, threshold voltage property of transistor i.e., operation mode can be adjusted.

Based on this, in this embodiment, the first transistor T1 is configured to have the etch stop layer ESL shifted to the drain electrode D, as shown in FIGS. 2 and 4. Accordingly, the overlap area between the etch stop layer ESL and the drain electrode D is greater than the overlap area between the etch stop layer ELS and the source electrode S. Accordingly, the threshold voltage of the first transistor T1 is negatively shifted, and thus is operated in the depletion mode.

The second transistor T2 is configured to have the etch stop layer ESL shifted to the source electrode S, as shown in FIGS. 3 and 5. Accordingly, the overlap area between the etch stop layer ESL and the source electrode S is greater than the overlap area between the etch stop layer ELS and the drain electrode D. Accordingly, the threshold voltage of the second transistor T2 is positively shifted, and thus is operated in the enhancement mode.

Alternatively, when the second transistor T2 is operated in the normal mode, the etch stop layer ESL is not required to be shifted.

As described above, the position of the etch stop layer ESL is shifted to the source electrode S or the drain electrode D, and thus property of transistor can be adjusted.

Therefore, a process of forming the inverter IV using the N type oxide transistors can be simpler than that of the related art.

In other words, in the related art, oxide semiconductor layers have different thicknesses, or double gate type is used, and thus production cost and process increase.

However, in the embodiment, by adjusting position of the etch stop layer ESL, the inverter IV using the N type oxide transistors can be manufactured. Therefore, production cost and process can be reduced.

It is preferred that the shift value (i.e., shift distance) of the first transistor T1 is about 1 um or more with respect to the second transistor T2. In other words, the overlap width between the etch stop layer ESL and the drain electrode D of the first transistor T1 is 1 um greater than the overlap width between the etch stop layer ESL and the drain electrode D of the second transistor T2, or more.

A gate driving circuit for a display device is configured using the inverter IV as above, which is explained with reference to FIGS. 7 to 9.

Figure 7:
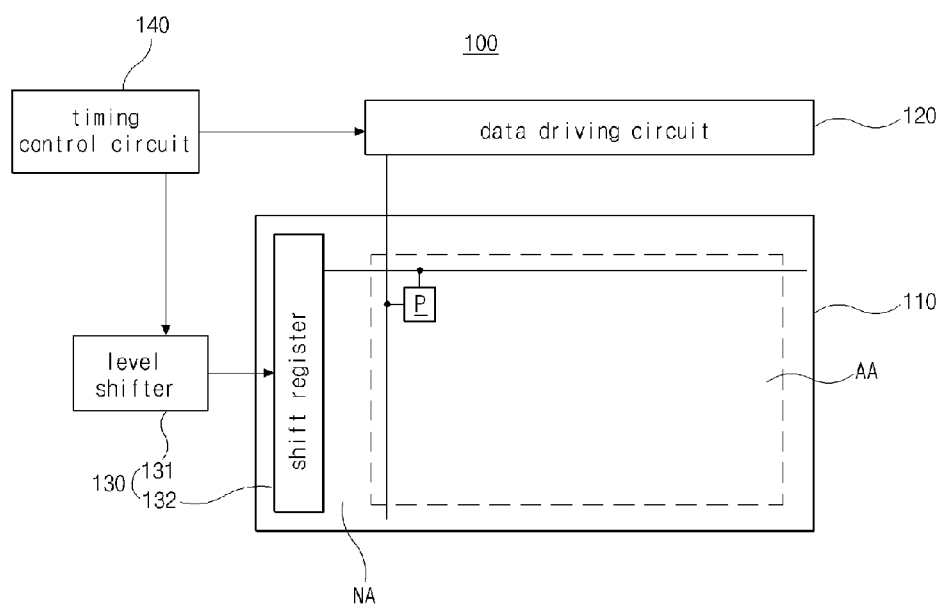
FIG. 7 is a schematic view illustrating a display device according to the embodiment of the present invention.
Figure 8:
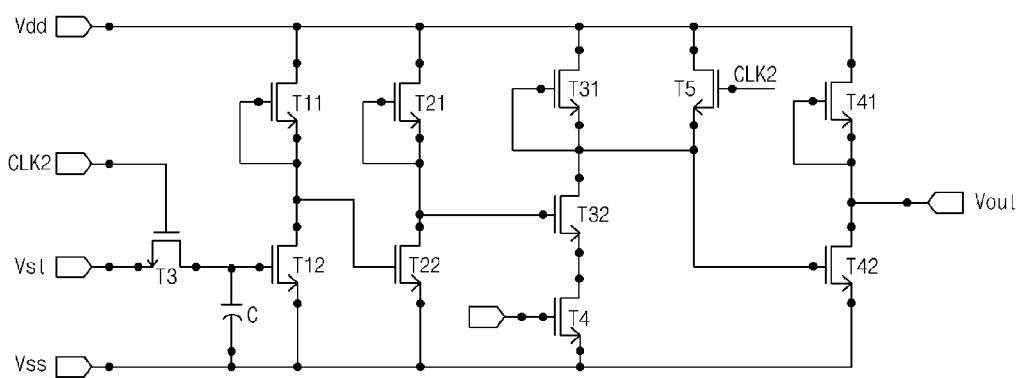
FIG. 8 is a circuit diagram of a gate driving circuit of the display device according to the embodiment of the present invention.
Figure 9:
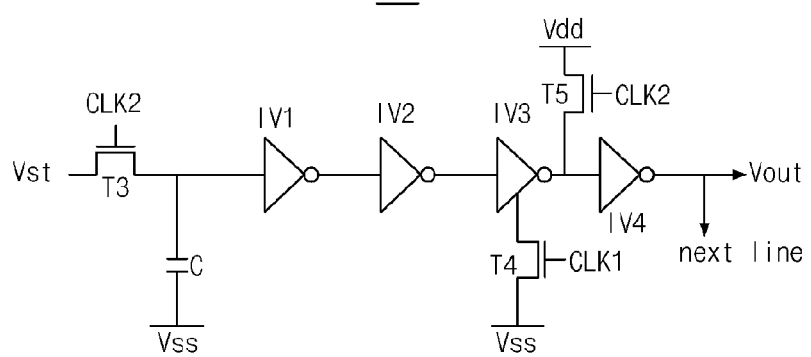
FIG. 9 is an equivalent circuit diagram of FIG. 8.

FIG. 7 is a schematic view illustrating a display device according to the embodiment of the present invention, FIG. 8 is a circuit diagram of a gate driving circuit of the display device according to the embodiment of the present invention, and FIG. 9 is an equivalent circuit diagram of FIG. 8.

Referring to FIG. 7, the display device 100 may include a display panel 110, and a driving circuit portion driving the display panel 110.

The driving circuit portion may include a data driving circuit 120, a gate driving circuit 13 and the timing control circuit 140.

The display panel 110 may include an array substrate and an opposing substrate facing the array substrate.

A plurality of pixels P are arranged in a display region AA of the display panel 110. The pixel P is connected to a gate line GL along a row direction and a data line DL along a column direction.

As the display panel 110, various display panels may be used, for example, liquid crystal display panel, field emission display panel, electroluminescent display panel including an inorganic electroluminescent display panel and an organic light emitting diode panel, and electrophoresis display panel. When the liquid crystal panel is used, a backlight unit is further required for the display device 100.

In case that uses the liquid crystal panel as the display panel 110, the pixel P may include a switching transistor connected to the gate and data lines GL and GL, and a liquid crystal capacitor and a storage capacitor connected to the switching transistor.

In alternative case that uses the organic light emitting diode panel as the display panel 110, the pixel P may include a switching transistor connected to the gate and data lines GL and GL, a driving transistor connected to the switching transistor, a storage capacitor connected between a gate electrode of the driving transistor and a high supply voltage source, and an organic light emitting diode connected to the driving transistor.

In the above cases, the transistors formed in the display region AA may be the N type semiconductor transistors used for the inverter.

The timing control circuit 140 is supplied with external timing signals, such as horizontal synchronizing signal, a vertical synchronizing signal, a data enable signal and a dot clock, from an external host system through an interface, such as a LVDS (low voltage differential signaling) interface, and a TMDS (transition minimized differential signaling) interface.

The timing control circuit 140 may generate data control signals controlling the data driving circuit 120 and gate control signals controlling the gate driving circuit 130 using the external timing signals.

The timing control circuit 140 is supplied with image data from the external system, and processes and supplies the image data to the data driving circuit 120.

The data driving circuit 120 may include, for example, a plurality of data driving ICs DIC. The data IC DIC may be connected to the display panel 110 in a COG (chip on glass) or COF (chip on film) type, and be electrically connected to the data line DL.

The data driving circuit 120 is supplied with the digital image data and the data control signals from the timing control circuit 140, and, in response to the control signals, outputs data voltages to the respective data lines DL. For example, according to the control signals, the data driving circuit 120 converts the input image data in parallel form, converts the image data into analog data voltages in positive/negative polarities, and outputs the data voltages to the respective data lines DL.

The gate driving circuit 130 sequentially supplies gate voltages Vout to the gate line GL according to the gate control signals from the timing control circuit 140.

At least portion of circuits constituting the gate driving circuit 130 may be configured in a GIP type that the at least portion is formed directly at the array substrate of the display panel 110.

The gate driving circuit 130 may include a level shifter 131 and a shift register 132.

The level shifter 131 level-shifts the gate control signal output from the timing control circuit 140 and outputs the level-shifted signal to the shift register 132.

The shift register 132 may be formed directly at the array substrate in the GIP type, and connected to an end of the gate line GL. In other words, in the process of forming array elements in the display region AA, the shift register 132 may be formed in the non-display region NA.

The shift register 132 may be formed using the inverter IV including the N type oxide transistor described above. The N type oxide transistor for the shift register 132 may be formed at the same process of forming the N type oxide transistor in the display region AA.

Referring to FIGS. 8 and 9, the shift register 132 may include a plurality of transistors. It is preferred that the plurality of transistors are N type oxide transistors.

The plurality of transistors may include first transistors T11, T21, T31 and T41, and second transistors T12, T22, T32 and T42, which constitute a plurality of inverters i.e., first to fourth inverters IV1 to IV4, and third to fifth transistors T3 to T5 which are controlled by clock signals CLK1 and CLK2.

The first transistors T11, T21, T31 and T41 used for the first to fourth inverters IV1 to IV4, respectively, are depletion mode transistors, and the second transistors T12, T22, T32 and T42 used for the first to fourth inverters IV1 to IV4, respectively, are normal mode or enhancement mode transistors. For the purpose of explanations, the enhancement mode second transistors are used in this embodiment.

The third to fifth transistors T3 to T5 may be, but not limited to, normal mode transistors.

The third transistor T3 is controlled by, for example, the second clock signal CLK2, and turns on/off an input signal, for example, a previous gate signal. In this embodiment, for the purpose of explanations, a case that the gate signal Vout is output to the first gate line and a gate start pulse Vst is input the third transistor T3 is described as an example.

An output signal of the third transistor T3 is input to the first to fourth inverters IV1 to IV4 connected in series.

The fourth transistor T4 is connected to the third inverter IV3, is controlled by, for example, the first clock signal CLK1, and turns on/off output of a low supply voltage Vss. An output signal from the fourth transistor T4 is input to a low supply voltage input terminal of the third inverter IV3.

The fifth transistor T5 is connected to a node between the third and fourth inverters IV3 and IV4, is controlled by, for example, the second clock signal CLK2, and turns on/off output of a high supply voltage Vdd. An output signal from the fifth transistor T5 is input to the fourth inverter IV4.

In the shift register 132 as described above, the related art bootstrap capacitor is not required to be at an output side of gate signal. Accordingly, stress due to the bootstrap in the related art can be prevented. Therefore, the shift register 132 of the embodiment can obtain reliability like the CMOS shift register, and can be stably operated.

The circuit design of the shift register 132 can be applied to the circuit design of the CMOS shift register.

Figure 10:
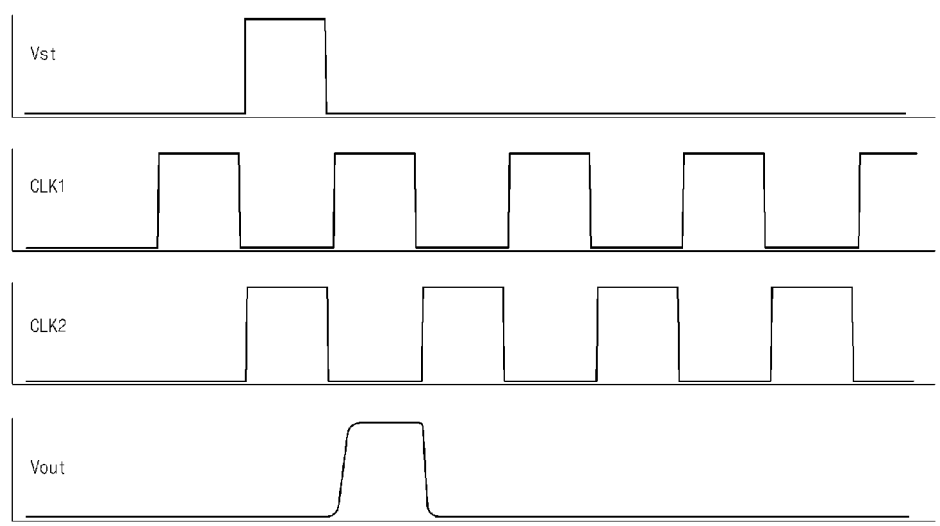
FIG. 10 is a view illustrating simulation results when using the gate driving circuit according to the embodiment of the present invention.

FIG. 10 is a view illustrating simulation results when using the gate driving circuit according to the embodiment of the present invention. It is shown that the gate signal Vout is stably output.

As described above, the position of the etch stop layer is shifted so that the overlap areas between the etch stop layer, and the source and drain electrodes is adjusted, thus the depletion mode and the enhancement mode of the oxide transistor can be effectively achieved, and thus the inverter similar to the CMOS circuit can be achieved.

Moreover, the gate driving circuit can be formed using such the inverter. This gate driving circuit has a high reliability like the CMOS driving circuit, compared with the related art NMOS or PMOS driving circuit where the transistor suffers from stress of high driving voltage by using the bootstrap principle.

As a result, the production cost and process can be reduced, and the circuit of high reliability like the CMOS circuit can be manufactured.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An inverter comprising:
a first N type oxide transistor operated in a depletion mode; and
a second N type oxide transistor operated in a normal mode or enhancement mode,
wherein an overlap area between an etch stop layer and a drain electrode of the first N type oxide transistor is greater than an overlap area between the etch stop layer and a source electrode of the first N type oxide transistor.

2. The inverter according to claim 1, wherein an overlap width between the etch stop layer and the drain electrode of the first N type oxide transistor is about 1 um greater than an overlap width between an etch stop layer and a drain electrode of the second N type oxide transistor, or more.

3. The inverter according to claim 1, wherein the second N type oxide transistor is operated in the enhancement mode.

4. A gate driving circuit of a display device, the circuit comprising:
a shift register including a plurality of inverters and outputting a gate signal; and
wherein each inverter includes:
a first N type oxide transistor operated in a depletion mode; and
a second N type oxide transistor operated in a normal mode or enhancement mode,
wherein an overlap area between an etch stop layer and a drain electrode of the first N type oxide transistor is greater than an overlap area between the etch stop layer and a source electrode of the first N type oxide transistor.

5. The circuit according to claim 4, wherein an overlap width between the etch stop layer and the drain electrode of the first N type oxide transistor is about 1 um greater than an overlap width between an etch stop layer and a drain electrode of the second N type oxide transistor, or more.

6. The circuit according to claim 4, wherein the shift register is formed at a display panel of the display device in a GIP (gate in panel) type.

7. The circuit according to claim 4, wherein the plurality of inverters includes first to fourth inverters sequentially located in an output direction of the gate signal, and
wherein the shifter register further includes:
a third transistor supplied with a previous gate signal, and controlling an output to the first inverter according to a second clock signal;
a fourth transistor controlling an output to a low supply voltage input terminal of the third inverter according to a first clock signal; and
a fifth transistor controlling an output of a high supply voltage to the fourth inverter according to the second clock signal.

8. A display device comprising:
a display panel; and
a gate driving circuit including a shift register outputting a gate signal to a gate line of the display panel,
wherein the shift register includes a plurality of inverters, and
wherein each inverter includes:
a first N type oxide transistor operated in a depletion mode; and
a second N type oxide transistor operated in a normal mode or enhancement mode,
wherein an overlap area between an etch stop layer and a drain electrode of the first N type oxide transistor is greater than an overlap area between the etch stop layer and a source electrode of the first N type oxide transistor.

9. The device according to claim 8, wherein an overlap width between the etch stop layer and the drain electrode of the first N type oxide transistor is about 1 um greater than an overlap width between an etch stop layer and a drain electrode of the second N type oxide transistor, or more.

10. The device according to claim 8, wherein the shift register is formed at a display panel of the display device in a GIP (gate in panel) type.

11. The device according to claim 8, wherein the plurality of inverters includes first to fourth inverters sequentially located in an output direction of the gate signal, and
wherein the shifter register further includes:
a third transistor supplied with a previous gate signal, and controlling an output to the first inverter according to a second clock signal;
a fourth transistor controlling an output to a low supply voltage input terminal of the third inverter according to a first clock signal; and
a fifth transistor controlling an output of a high supply voltage to the fourth inverter according to the second clock signal.

* * * * *